(12) United States Patent
Nickerson et al.

(10) Patent No.: US 7,250,684 B2
(45) Date of Patent: Jul. 31, 2007

(54) CIRCULAR WIRE-BOND PAD, PACKAGE MADE THEREWITH, AND METHOD OF ASSEMBLING SAME

(75) Inventors: Robert Nickerson, Chandler, AZ (US); Brian Taggart, Phoenix, AZ (US); Hai Ding, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 10/881,741

(22) Filed: Jun. 30, 2004

(65) Prior Publication Data

US 2006/0000876 A1 Jan. 5, 2006

(51) Int. Cl.
*H01L 23/52* (2006.01)
*H01L 23/48* (2006.01)
*H01L 29/40* (2006.01)

(52) U.S. Cl. .............................. 257/777; 257/E25.013; 257/685; 257/686; 257/723; 438/108; 438/109; 361/760; 228/180.5; 228/4.5

(58) Field of Classification Search ........ 257/E27.137, 257/E27.144, E27.161, 686, 777, 784, E25.013, 257/685, 723; 438/108, 109; 361/760; 228/180.5, 228/4.5
See application file for complete search history.

(56) References Cited

U.S. PATENT DOCUMENTS

| | | | | |
|---|---|---|---|---|
| 5,804,004 A | * | 9/1998 | Tuckerman et al. | 156/60 |
| 5,889,324 A | * | 3/1999 | Suzuki | 257/712 |
| 6,181,002 B1 | * | 1/2001 | Juso et al. | 257/686 |
| 6,239,496 B1 | * | 5/2001 | Asada | 257/777 |
| 6,333,562 B1 | * | 12/2001 | Lin | 257/777 |
| 6,340,846 B1 | * | 1/2002 | LoBianco et al. | 257/783 |
| 6,476,506 B1 | * | 11/2002 | O'Connor et al. | 257/786 |
| 6,570,249 B1 | * | 5/2003 | Liao et al. | 257/724 |
| 6,710,455 B2 | * | 3/2004 | Goller et al. | 257/777 |
| 2003/0047813 A1 | * | 3/2003 | Goller et al. | 257/777 |

* cited by examiner

*Primary Examiner*—Kenneth Parker
*Assistant Examiner*—Chris Chu
(74) *Attorney, Agent, or Firm*—Schwegman, Lundberg, Woessner & Kluth P.A.

(57) ABSTRACT

A wire-bonding substrate includes a curvilinear wire-bond pad. The curvilinear wire-bond pad is used in reverse wire bonding to couple a die with the substrate. A curvilinear wire-bond pad is also disclosed that is located directly above the via in the substrate. A wire-bonding substrate includes a first wire-bond pad and a first via that is disposed directly below the first wire-bond pad in the wire-bonding substrate. A package is includes a chip stack with a total die-side characteristic dimension, and a total substrate-side characteristic dimension that is smaller than the total die-side characteristic dimension. A computing system includes the curvilinear wire-bond pad.

4 Claims, 9 Drawing Sheets

CIRCULAR WIRE-BOND PAD, PACKAGE MADE THEREWITH, AND METHOD OF ASSEMBLING SAME

TECHNICAL FIELD

Disclosed embodiments relate to a wire-bond technology for an electrical circuit substrate. More particularly, disclosed embodiments relate to a curvilinear bond pad.

BACKGROUND INFORMATION

DESCRIPTION OF RELATED ART

A wire-bonding package usually requires significant routing of traces within a printed circuit board (PCB). The advent of wireless technologies has led to a push to miniaturize packaged integrated circuits to such an extent that conventional wire bonding has become a hindrance. Conventional wire-bond pad geometries present a challenge to miniaturization.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die. A board can be prepared with a bond pad, also referred to as a bond finger, that is flush with the board, or the bond pad can be set upon the board surface. As depicted in this disclosure, a bond pad is not limited to being flush or being set upon the surface only because it is illustrated as such, unless it is explicitly stated in the text.

Reference will now be made to the drawings wherein like structures will usually be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
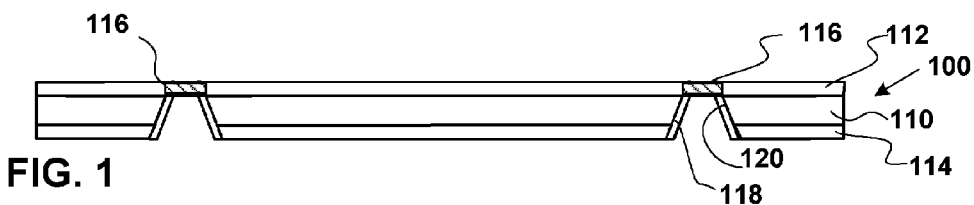
FIG. 1 is a side cross-section of a mounting substrate according to an embodiment.

FIG. 1 is a side cross-section of a mounting substrate 100 according to an embodiment. The mounting substrate 100 includes a substrate core 110, an upper protective layer 112, and a lower protective layer 114. A curvilinear wire-bond pad (CWP) 116 is depicted on the upper protective layer 112. The CWP 116 is surmounted by a wire-bonding ball 115 (FIG. 2) that assists in the wire-bonding process. In an embodiment, the wire-bonding process includes a reverse wire-bonding process. In an embodiment, the wire-bonding process includes a forward wire-bonding process.

By "curvilinear" it is meant that the footprint of the CWP is at least partially curvilinear. In an embodiment, curvilinear means circular. In an embodiment, curvilinear means eccentric circular. In an embodiment, curvilinear means including a non-rectilinear portion, but also a rectilinear portion. In an embodiment, curvilinear means at least two of the articulated embodiments. An array of circular wire-bond pads can be deployed in a smaller area than an array of square wire-bond pads. Consequently, a denser wire-bond pad scheme can be accomplished. Further, routing of traces within a board can allow the traces to pass between circular wire-bond pads because the rectilinear corners, which otherwise take up space that does not contact the bond wires, are not present. Embodiments of CWPs are set forth in this disclosure.

In an embodiment, the CWP 116 is depicted as a structure that is flush with the upper protective layer 112. In an embodiment, a via liner 118 is a metallic or otherwise electrically conductive material that provides an electrical path through the mounting substrate 100, within a via 120.

Formation of the via 120 can be accomplished by various process flows. In an embodiment, the CWP 116 is first formed, and the via 120 is formed by laser drilling through the lower protective layer 114, the substrate core 110, and finally through the upper protective layer 112. In an embodiment, the laser drilling is operated to stop on the curvilinear wire-bond pad 116. In an embodiment, laser drilling is done by drilling at a site that is later occupied by the CWP 116. In an embodiment, the laser drilling is done first, and the placement of the CWP 116 is done subsequently.

In an embodiment, the via 120 and the CWP 116 are not vertically aligned. Although the illustrations in this disclosure depict the via and the CWP being vertically aligned, in one embodiment, the via and the CWP are in electrical contact with each other, but the CWP need not be directly above the via.

Figure 2:
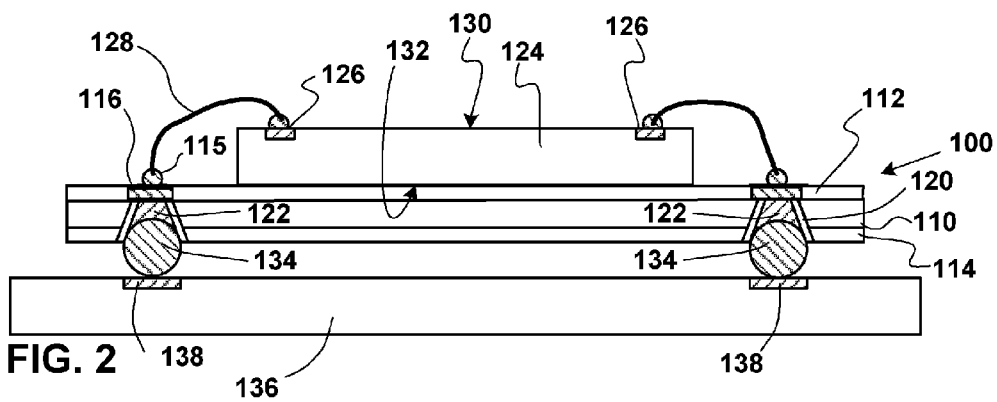
FIG. 2 is a side cross-section of the mounting substrate in FIG. 1 after assembly with a die to form a package, according to an embodiment.

FIG. 2 is a side cross-section of the mounting substrate 100 in FIG. 1 after assembly with a die 124 to form a package, according to an embodiment. In an embodiment, the via 120 is filled with an interconnect 122. In an embodiment, the via 120 is not filled, as depicted in FIG. 1, and the electrical path relies substantially upon the via liner 118.

The die 124 is depicted mounted upon the mounting substrate 100 at the upper protective layer 112. The die 124 includes an active surface 130 and a backside surface 132. Electrical coupling of the die 124 to the via 120 is done between a die bond pad 126, a bond wire 128, and the wire-bond pad 116. The die bond pad 126 is disposed upon the active surface 130 of the die 124. The die 124 is adhered to the mounting substrate 100 by a material such as an organic thermal adhesive or the like, although it is not depicted. The adhesive is disposed between the backside surface 132 of the die 124 and the upper protective layer 112.

FIG. 2 also depicts electrical coupling of the die 124 to a larger substrate 136. The die 124 is coupled to a bump 134, which in an embodiment, is at least partially disposed in the via 120. The larger substrate 136 is couple to the bump 134 by a larger substrate bond pad 138. The bump 134 can be any electrical connection such as a solder ball. According to an embodiment, the vertical profile of the entire package is lower due to the bump 134 being at least partially embedded in the mounting substrate 100. In an embodiment, the larger substrate 136 may be a motherboard, a mezzanine board, an expansion card, or others. In an embodiment, the larger substrate 136 is a penultimate casing for a handheld device such as a wireless telephone.

In an embodiment, a process of wirebonding includes reverse wire bonding. The process includes first attaching the bond wire 128 at the CWP 116 and the wire-bonding ball 115, followed by second attaching the bond wire 128 at the die bond pad 126. In an embodiment, a process of wirebonding includes forward wire bonding. The process includes first attaching the bond wire 128 at the die bond pad 126, followed by second attaching the bond wire 128 at the CWP 116 and the wire-bonding ball 115.

Figure 3:
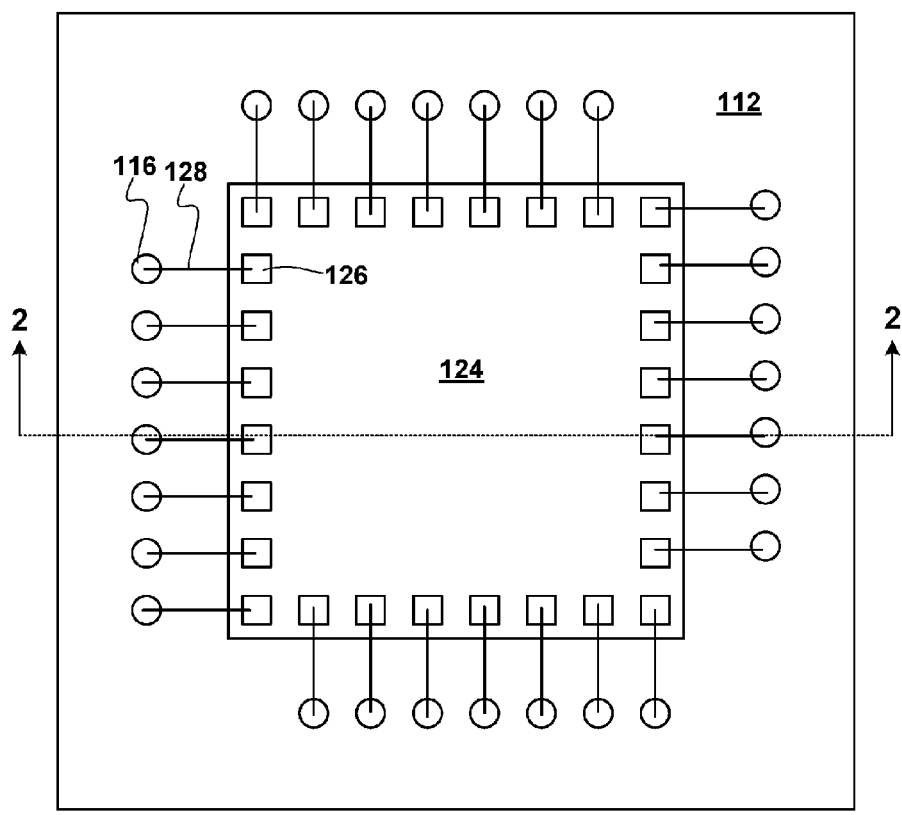
FIG. 3 is a top plan of a package similar to the package depicted in FIG. 2 according to an embodiment.

FIG. 3 is a top plan of a package similar to the package depicted in FIG. 2 according to an embodiment. The view of FIG. 2 can be taken along the line 2—2. The die 124 is depicted mounted upon the upper protective layer 112. The die bond pad 126 is coupled to the CWP 116 through the bond wire 128. In this embodiment, the plurality of CWPs 116 is depicted as substantially the same size and pitch as the plurality of die bond pads 126. By "substantially the same size and pitch" it is understood that where the wire-bond pads 116 are spaced from each other on e.g., 200 micrometer (item) centers, the die bond pads 126 are similarly spaced on 200 μm centers. In an embodiment, the pitch is in a range from about 50 μm to about 200 μm. In an embodiment, the pitch is about 135 μm.

Figure 4:
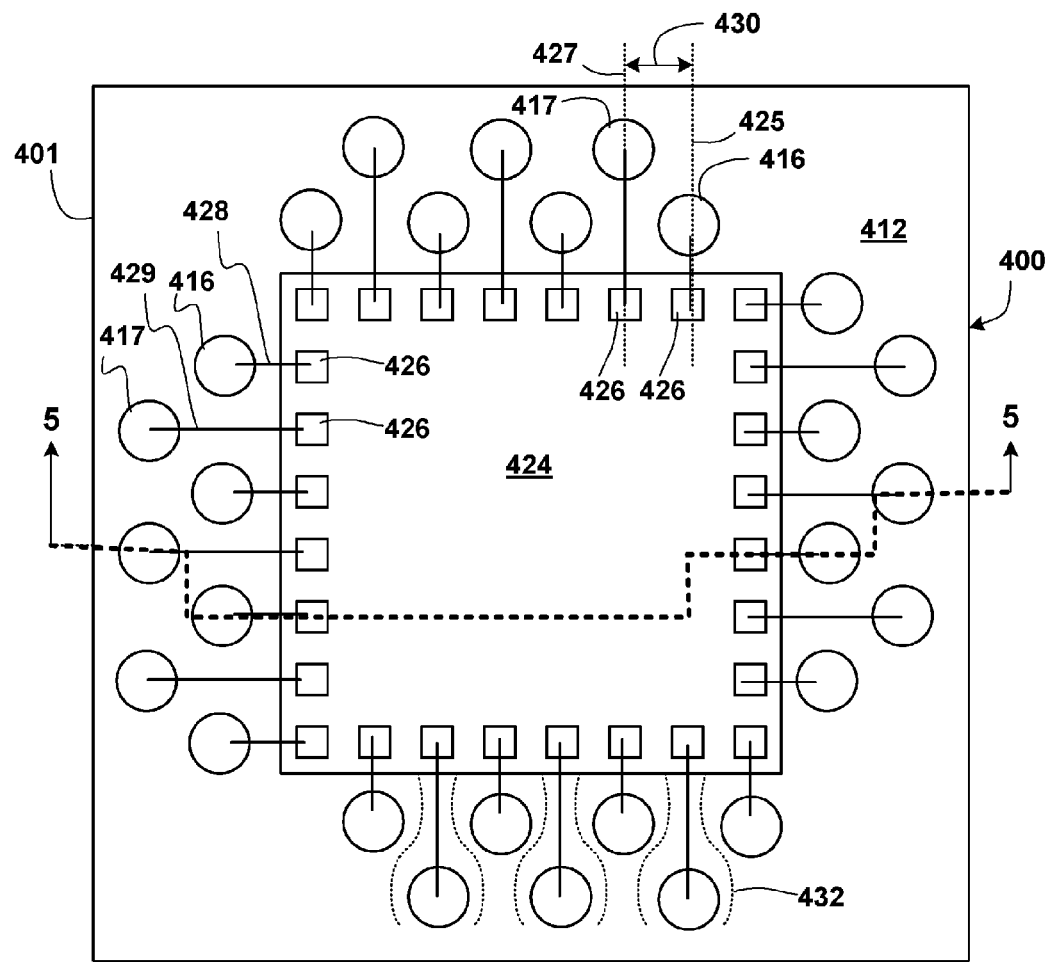
FIG. 4 is a top plan of a package according to an embodiment.

FIG. 4 is a top plan of a package according to an embodiment. A die 424 is depicted mounted upon an upper protective layer 412 of a mounting substrate 400. A plurality of first CWPs 416 is arrayed substantially parallel to an edge 401 of the mounting substrate 400. A plurality of second CWPs 417 is also arrayed substantially parallel to the edge 401 of the mounting substrate 400. The plurality of second CWPs 417, however, is arrayed at a distance from the edge 401 that is less than the distance from the edge 401 of the plurality of first CWPs 416. In other words, a given first CWP 416 and a given second CWP 417 are arrayed in a staggered configuration with respect to the edge 401 of the mounting substrate 400. In an embodiment, the staggered configuration allows a larger bump (not pictured) to couple the die 424 to the outside world, without shorting into a contiguous bump. In an embodiment, the plurality of first CWPs 416 is arrayed with a first pitch in relation to the plurality of second CWPs 417.

The staggered configuration includes substantially the same pitch as the plurality of die bond pads 426. The substantially same pitch is defined by the spacing 430, which is the orthogonal distance between a first symmetry line 425 and a second symmetry line 427. In other words, the overall pitch of the CWPs 416, 417 is staggered. The staggered CWPs 416 and 417 include a second pitch that is quantified by a first CWP 416 disposed along the first symmetry line 425 and a second CWP 417 disposed along the second symmetry line 427. As set forth herein, the first symmetry line 425 and the second symmetry line 427 are spaced apart by a distance substantially equivalent to the first pitch of the die bond pads 426.

With the presence of the staggered CWP configuration, routing of traces 432 between two CWPs and within the mounting substrate 400 can be accomplished. FIG. 4 illustrates several traces 432 that are depicted in phantom lines as being below the upper protective layer 412.

Figure 5:
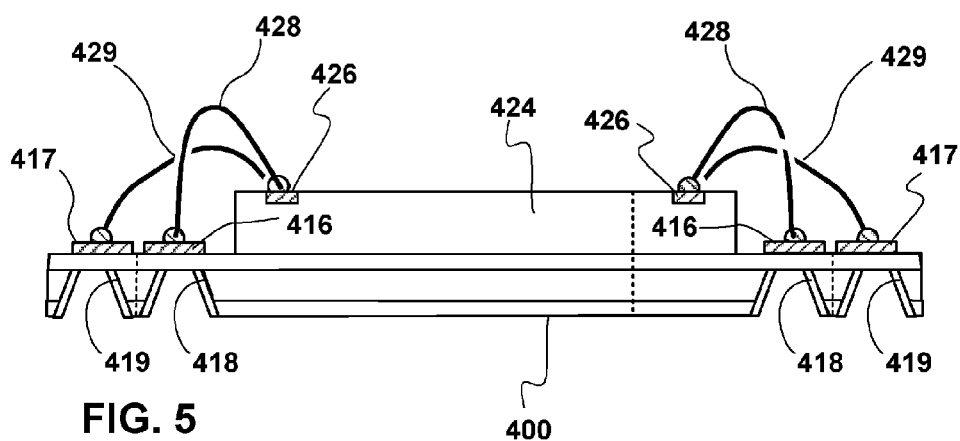
FIG. 5 is a side cut-away of the package depicted in FIG. 4 according to an embodiment.

FIG. 5 is a side cut-away of the package depicted in FIG. 4 according to an embodiment. The substrate 400 includes a first via 418 and a second via 419. As taken along the line 5—5 in FIG. 4, the substrate 400 is cut away to reveal the staggered configuration of the first via 418 and the second via 419. In an embodiment, the first via 418 is disposed directly below the first CWP 416. Similarly in an embodiment, the second via 419 is disposed directly below the second CWP 417. In an embodiment (not pictured), only one of the first via 418 and the second via 419 is disposed directly below its respective CWP. In an embodiment (not pictured), neither the first via 418 nor the second via 419 is disposed directly below its respective CWP.

In an embodiment, electronic tuning of the package is done by making the first bond wire 428 the same length, or the like, as the second bond wire 429. Although the first CWP 416 is closer to its respective die bond pad 426 than the second CWP 417 is to its respective die bond pad (not pictured), the lengths of the respective bond wires 428 and 429 are tuned to achieve a similar signal delay during operation of the die 424.

In an embodiment, a process of wirebonding includes reverse wire bonding. The process includes first attaching the first bond wire 428 at the first CWP 416, followed by second attaching the first bond wire 428 at a first die bond pad 426. Similarly, the process includes first attaching the second bond wire 429 at the second CWP 417, followed by second attaching the second bond wire 429 at a second die bond pad (not pictured). In an embodiment, a process of wirebonding includes forward wire bonding. The process includes first attaching the first bond wire 428 at the first die bond pad 426, followed by second attaching the first bond wire 428 at the first CWP 416. Similarly, the process includes first attaching the second bond wire 429 at a second die bond pad (not pictured), followed by second attaching the second bond wire 429 at the second CWP 417.

Figure 6:
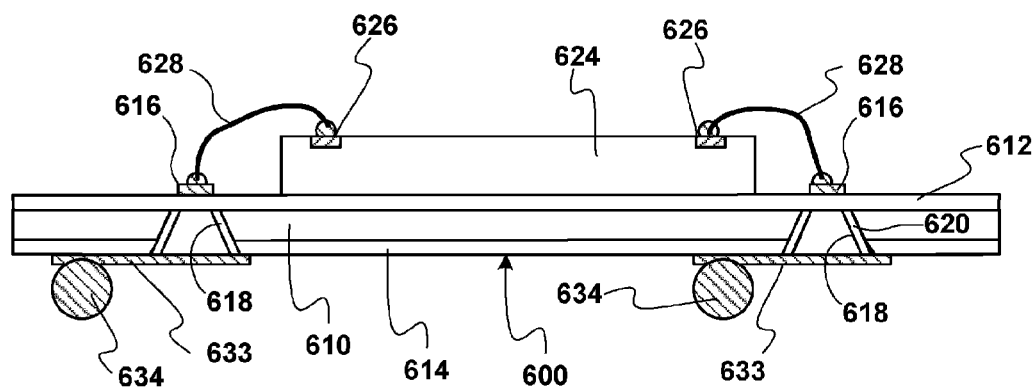
FIG. 6 is a side cross-section of a package according to an embodiment.

FIG. 6 is a side cross-section of a package according to an embodiment. In an embodiment, it is not always the case that a given bump can be or is desired to be lodged in the via with which it communicates. FIG. 6 depicts a mounting substrate 600 that includes a substrate core 610, an upper protective layer 612, and a lower protective layer 614. A first via 618 is depicted penetrating the substrate core 610, the upper protective layer 612, and the lower protective layer 614. A CWP 616, also referred to as a curvilinear bond finger 616 is depicted directly above the first via 618. In an embodiment, a second via (not pictured) such as the second via 419 in FIG. 5, provides electrical communication for a staggered CWP array such as is depicted in FIG. 4.

The CWP 616 is depicted as a raised structure above the upper protective layer 612. In an embodiment, the CWP 616 is at least flush with the upper protective layer 612. In an embodiment, a via liner 620 is a metallic or otherwise electrically conductive material that provides an electrical path through the mounting substrate 600.

FIG. 6 also depicts a die 624 disposed upon the upper protective layer 612. Additionally, a bump 634 is disposed below the mounting substrate 600 but not directly below the first via 618. The bump 634 is coupled to the first via 618 by a first trace 633. Consequently, the die 624 communicates to the bump 634 commencing with a die bond pad 626, the bond wire 628, the first CWP 616, and the trace 633.

In an embodiment, the first via 618 is filled with an interconnect (not pictured) such as the interconnect 122 depicted in FIG. 2. In an embodiment, the first via 618 is not filled, as depicted in FIG. 6, and the electrical path relies substantially upon the via liner 620. Electrical coupling of the die 624 to the first via 618 is done between the die bond pad 626, the bond wire 628, and the CWP 616.

In an embodiment, a process of wirebonding includes reverse wire bonding. The process includes first attaching the first bond wire 628 at the first CWP 616, followed by second attaching the first bond wire 628 at a first die bond pad 626. Where a second bond wire is present for a staggered CWP with respect to the first CWP 616, the process includes first attaching the second bond wire at the second CWP, followed by second attaching the second bond wire at a second die bond pad. In an embodiment, a process of wirebonding includes forward wire bonding. The process includes first attaching the first bond wire 628 at the first die bond pad 626, followed by second attaching the first bond wire 628 at the first CWP 616. Where a second bond wire is present for a staggered CWP with respect to the first CWP 616, the process includes first attaching the second bond wire at a second die bond pad (not pictured), followed by second attaching the second bond wire at the second CWP.

Figure 7:
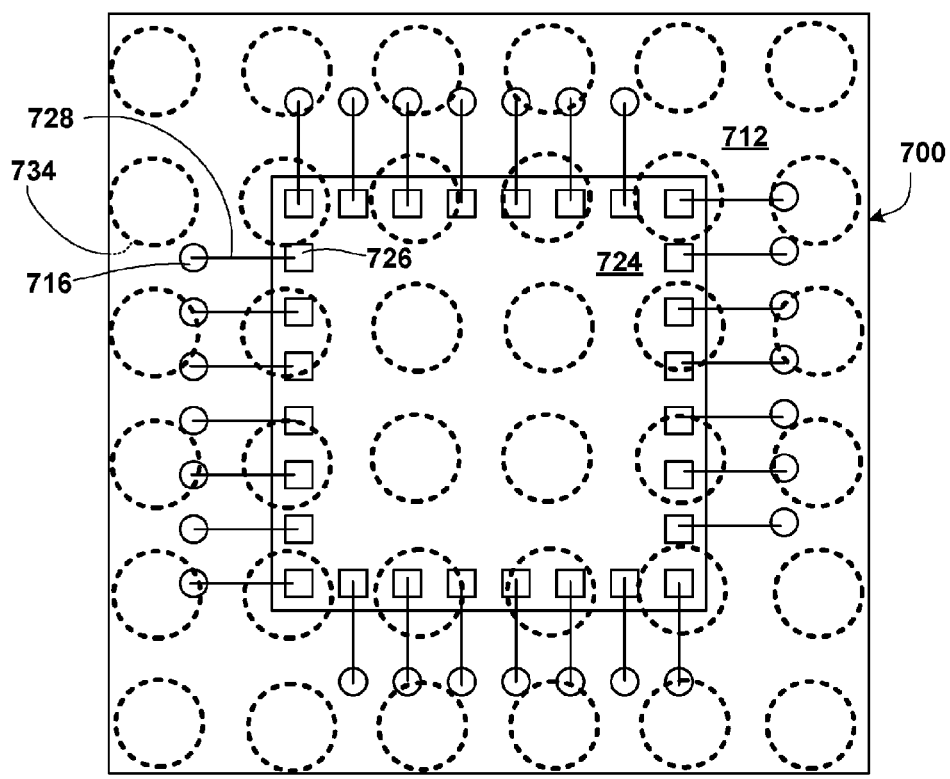
FIG. 7 is a top plan of a package similar to the package depicted in FIG. 6 according to an embodiment.

FIG. 7 is a top plan of a package similar to the package depicted in FIG. 6 according to an embodiment. A die 724 is depicted mounted upon an upper protective layer 712 of a mounting substrate 700. A die bond pad 726 is coupled to a CWP 716 through a bond wire 728. In this embodiment, the plurality of CWPs 716 is depicted as substantially the same size and pitch as the plurality of die bond pads 726. The CWPs 716, however, are not depicted as directly over any given bump 734, which are depicted in phantom lines. Accordingly, a trace (not pictured) such as the trace 633 depicted in FIG. 6, couples the CWP 716 to a given bump 734. According to this embodiment, a uniform or substantially uniform ball-grid array (BGA) such as the bumps 734 can be achieved, while maintaining the embodiment of having each CWP directly over a via. In an embodiment, however, at least one CWP is disposed directly over its respective via, but not all wire-bond pads in the package are thus disposed.

In an embodiment, a process of wirebonding includes reverse wire bonding. The process includes first attaching the first bond wire 728 at the first CWP 716, followed by second attaching the first bond wire 728 at a first die bond pad 726. In an embodiment, a process of wirebonding includes forward wire bonding. The process includes first attaching the first bond wire 728 at the first die bond pad 726, followed by second attaching the first bond wire 728 at the first CWP 716.

Figure 8:
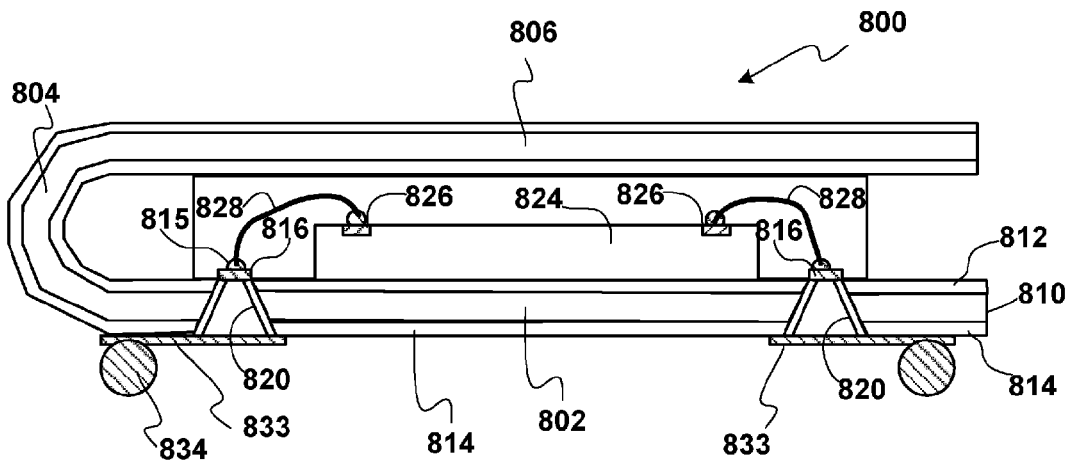
FIG. 8 is a side cross-section of a package according to an embodiment.

FIG. 8 is a side cross-section of a package according to an embodiment. In an embodiment, a mounting substrate 800 includes a substrate core 810, an upper protective layer 812, and a lower protective layer 814. The substrate 800 also includes a die-level section 802, a folded section 804, and an above-die section 806. In this embodiment, the folded mounting substrate 800 can allow for a smaller footprint of the mounting substrate when it is deployed into a computing system.

A first via 820 is depicted penetrating the substrate core 810, the upper protective layer 812, and the lower protective layer 814. A CWP 816 and a wire-bonding ball 815 are depicted directly above the first via 820. In an embodiment, a second via (not pictured) such as the second via 419 in FIG. 5, provides electrical communication for a staggered CWP array such as is depicted in FIG. 4.

FIG. 8 also depicts a die 824 disposed upon the upper protective layer 812. Additionally, a bump 834 that is not directly below the first via 820, is disposed below the mounting substrate 800. The bump 834 is coupled to the first via 820 by a first trace 833. Consequently, the die 824 communicates to the bump 834 commencing with a die bond pad 826, the bond wire 828, the first CWP 816, and the trace 833.

In an embodiment, a process of wirebonding includes reverse wire bonding as set forth herein. Where a second bond wire is present for a staggered wire-bond pad with respect to the first CWP 816, the process includes first attaching the second bond wire at the second CWP, followed by second attaching the second bond wire at a second die bond pad. In an embodiment, a process of wirebonding includes forward wire bonding as set forth herein.

Figure 9:
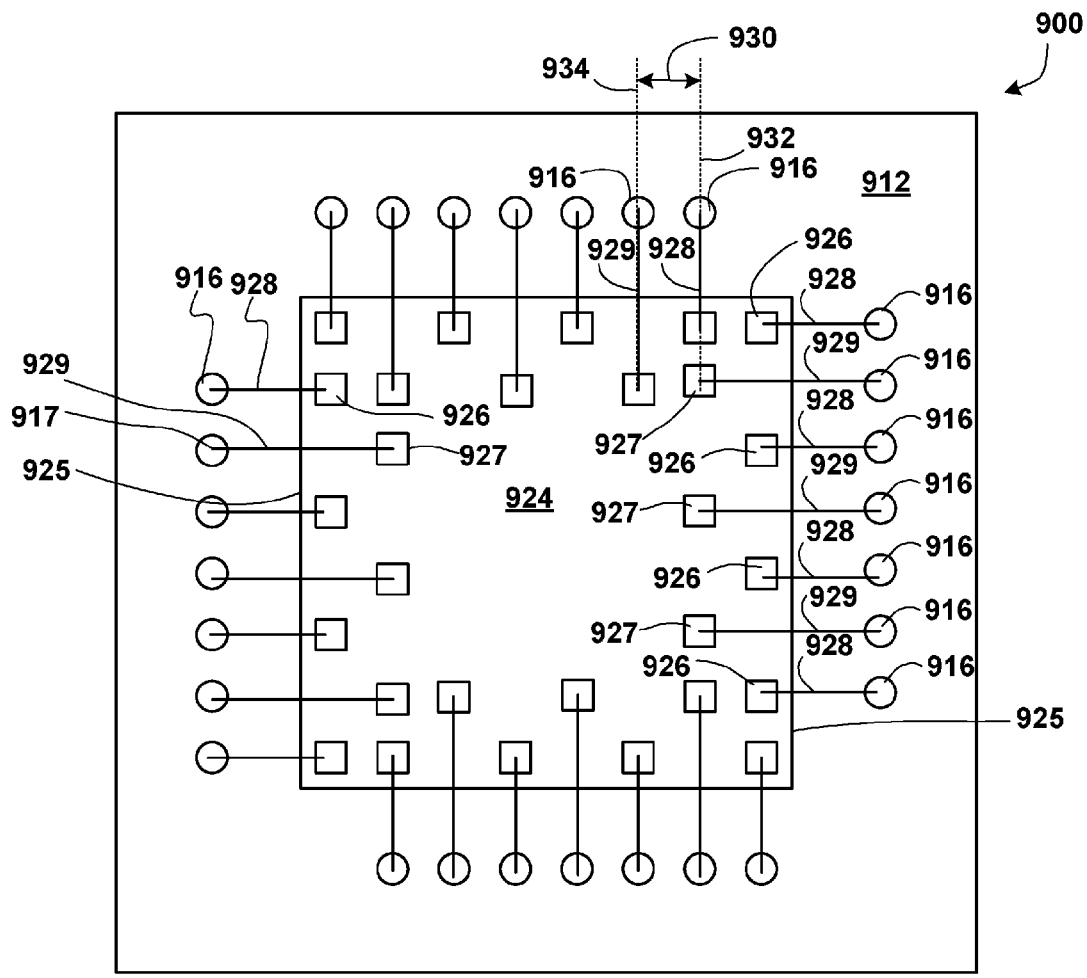
FIG. 9 is a top plan of a package according to an embodiment.

FIG. 9 is a top plan of a package 900 according to an embodiment. In FIG. 9, an upper protective layer 912 supports a die 924 including a die edge 925. A first plurality of die bond pads 926 are proximate the die edge 925 at a first distance. A second plurality of die bond pads 927 are proximate the die edge 925 at a second distance. The first plurality of die bond pads 926 and the second plurality of die bond pads 927 are arrayed in a staggered configuration with respect to the die edge 925. In this embodiment, a plurality of CWPs 916 is arrayed in a linear pattern with respect to the die edge 925. The package 900 illustrates the CWPs 916 arrayed with a first pitch in relation to the staggered configuration of the first and second die bond pads 926 and 927, respectively. The staggered configuration includes substantially the same pitch as the CWPs 916. The substantially same pitch is defined by the spacing 930 between a first symmetry line 932 and a second symmetry line 934.

Each first die bond pad 926 is coupled to a respective first CWP 916 by a first bond wire 928. Similarly, each second die bond pad 927 is coupled to a respective second CWP 917 by a second bond wire 929. In an embodiment, electronic tuning of the package is done by making the first bond wire 928 the same length, or the like, as the second bond wire 929.

In an embodiment, a process of wirebonding includes reverse wire bonding as set forth herein. Where a second bond wire is present for a second die bond pad 927 with respect to the first die bond pad 926, the process includes first attaching the second bond wire at the first CWP 926, followed by second attaching the second bond wire at a second die bond pad 927. In an embodiment, a process of wirebonding includes forward wire bonding as set forth herein.

Figure 10:
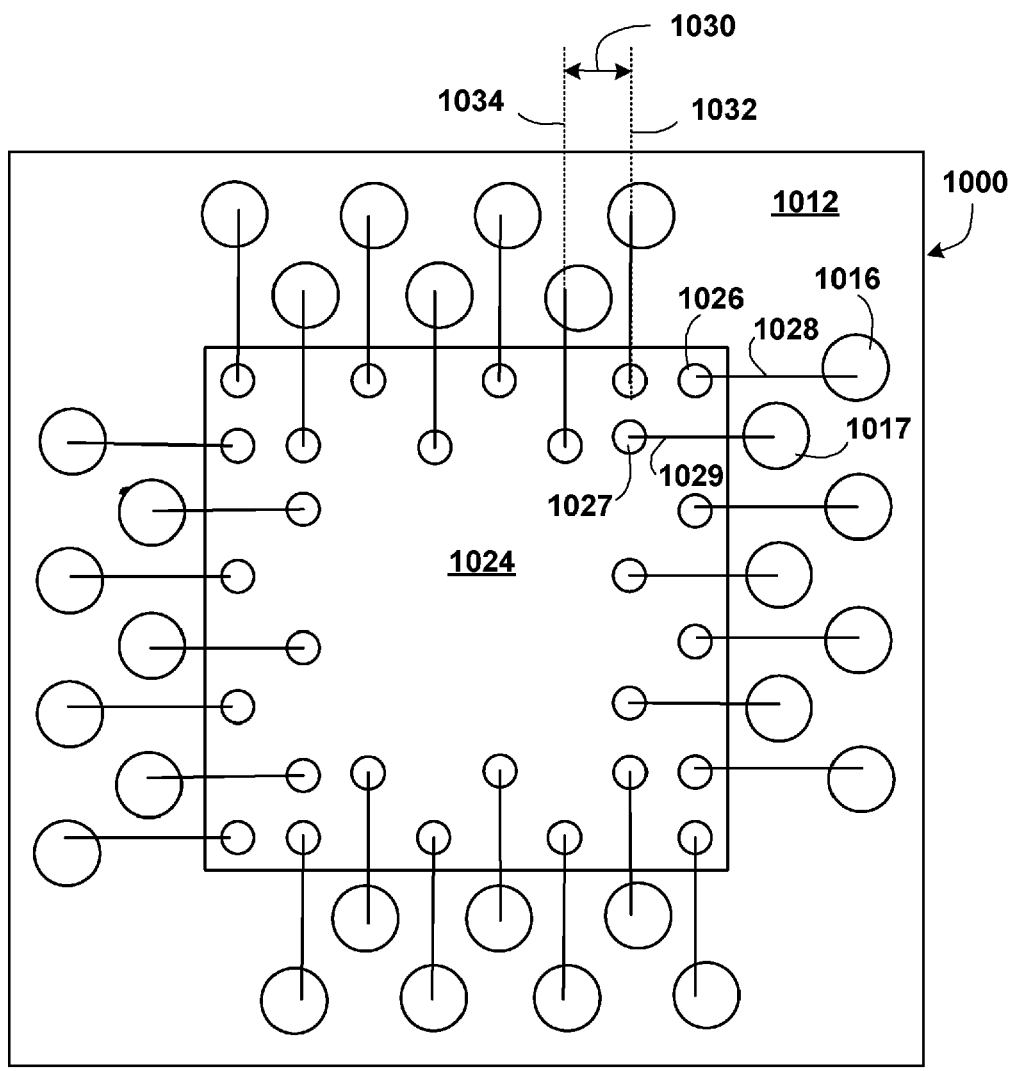
FIG. 10 is a top plan of a package according to an embodiment.

FIG. 10 is a top plan of a package according to an embodiment. A die 1024 is depicted mounted upon an upper protective layer 1012 of a mounting substrate 1000. In this embodiment, at least the die bond pads are curvilinear die bond pads (CDPs). In an embodiment, the wire-bond pads are CWPs.

In this embodiment, both the CDPs 1026 and 1027 are staggered, as well as the CWPs 1016 and 1017. In an embodiment, the bond wires 1028 and 1029 are all substantially the same electronically with regard to tuning the package.

The package 1000 illustrates first and second CWPs 1016 and 1017, respectively, arrayed with a first pitch in relation to the staggered configuration of the first and second CDPs 1026 and 1027, respectively, each with substantially the same pitch as the wire-bond. The substantially same pitch is defined by the spacing 1030 between a first symmetry line 1032 and a second symmetry line 1034.

In an embodiment, a process of wirebonding includes reverse wire bonding as set forth herein. In an embodiment, a process of wirebonding includes forward wire bonding as set forth herein.

Figure 11:
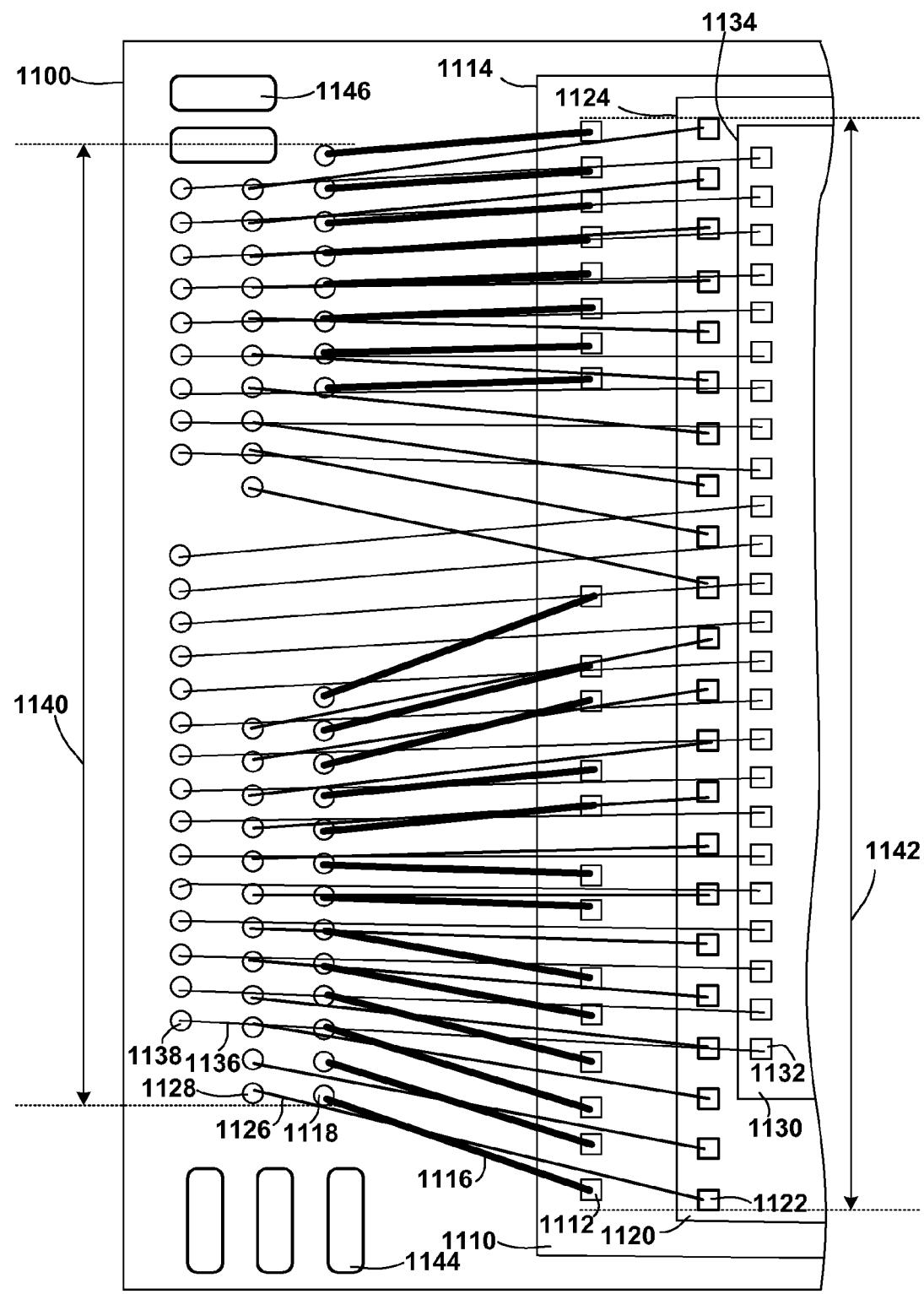
FIG. 11 is a top plan of a stacked-die package according to an embodiment.

FIG. 11 is a top plan of a package according to an embodiment. In an embodiment, the package includes a first die 1110 disposed on a mounting substrate 1100. In an embodiment, the first die 1110 includes a plurality of first die bond pads 1112 disposed along a first edge 1114 of the first die 1110. In an embodiment the plurality of first die bond pads 1112 is a plurality of curvilinear first die bond pads (first CDPs, pictured as rectilinear, however) 1112 as set forth in this disclosure. The first die 1110 is coupled to the mounting substrate 1100 through a plurality of first bond wires, one of which is designated with the reference numeral 1116. Coupling of the first die 1110 to the mounting substrate 1100 is completed by contact of the plurality of first bond wires 1116 with a plurality of first curvilinear wire-bond pads (first CWPs) 1118. In an embodiment the plurality of first CWPs 1118 is curvilinear according to any of the embodiments in this disclosure.

FIG. 11 also illustrates a second die 1120 disposed on the mounting substrate 1100 according to an embodiment. In an embodiment, the second die 1120 includes a plurality of second die bond pads 1122 disposed along a first edge 1124 of the second die 1120. In an embodiment the plurality of second die bond pads 1122 is a plurality of curvilinear second die bond pads (second CDPs, pictured as rectilinear, however) 1122 as set forth in this disclosure. The second die 1120 is coupled to the mounting substrate 1100 through a plurality of second bond wires, one of which is designated with the reference numeral 1126. Coupling of the second die 1120 to the mounting substrate 1100 is completed by contact of the plurality of second bond wires 1126 with a plurality of second curvilinear wire-bond pads (second CWPs) 1128. In an embodiment the plurality of second CWPs 1128 is curvilinear according to any of the embodiments in this disclosure.

FIG. 11 also illustrates a third die 1130 disposed on the mounting substrate 1100 according to an embodiment. In an embodiment, the third die 1130 includes a plurality of third die bond pads 1132 disposed along a first edge 1134 of the third die 1130. In an embodiment the plurality of third die bond pads 1132 is a plurality of curvilinear third die bond pads (third CDPs, pictured as rectilinear, however) 1132 as set forth in this disclosure. The third die 1130 is coupled to the mounting substrate 1100 through a plurality of third bond wires, one of which is designated with the reference numeral 1136. Coupling of the third die 1130 to the mounting substrate 1100 is completed by contact of the plurality of third bond wires 1136 with a plurality of third curvilinear wire-bond pads (third CWPs) 1138. In an embodiment the plurality of third CWPs 1138 is curvilinear according to any of the embodiments in this disclosure.

In an embodiment, the curvilinearity of the wire-bond pads on the mounting substrate 1100 allows for traces leading away from at least the first CWPs 1118 and the second CWPs 1128, to pass between various of the third CWPs 1138 to reach pin-out locations (not illustrated) elsewhere on the mounting substrate 1100. Such routing of traces between two CWPs and within the mounting substrate 1100 can be accomplished similar to the illustration of embedded traces 432 in FIG. 4.

Formation of at least the first die 1110 and the second die 1120 allows for a dense geometry. The dense geometry is defined by the first CWPs 1118 and the second CWPs 1128 as they occupy a first characteristic dimension 1140. The dense geometry is further defined by the first CDPs 1112 and the second CDPs 1122 as they occupy a second characteristic dimension 1142. The dense geometry is quantified by observing that the second characteristic dimension 1142, remarkably, is greater than the first characteristic dimension 1140. Accordingly, the presence of single components 1144 and/or of complementary dies of a chipset 1146, each depicted in arbitrary size and shape, can be achieved to facilitate miniaturization. Consequently, embedded traces similar to the illustration of embedded traces 432 in FIG. 4 can facilitate coupling any surface-mounted component(s) to the at least two dice.

Similarly, if the structure includes a third die such at the third die 1130, the dense geometry is quantified by observing that a first characteristic dimension is smaller than a second characteristic dimension.

Figure 12:
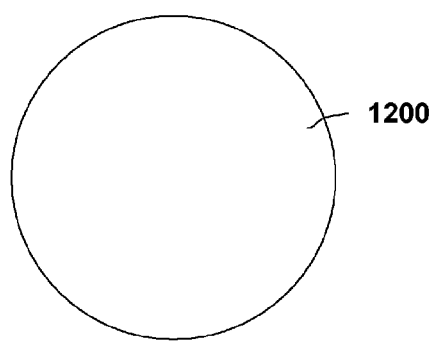
FIGS. 12 through 15 are plans of several curvilinear bond finger embodiments.

FIG. 12 is a top plan of a wire-bond pad 1200, also referred to as a bond finger 1200. The wire-bond pad 1200 exhibits a circular footprint as it appears upon a mounting substrate (not pictured). Consequently, the circular footprint is one embodiment of a curvilinear footprint as set forth in this disclosure.

Figure 13:
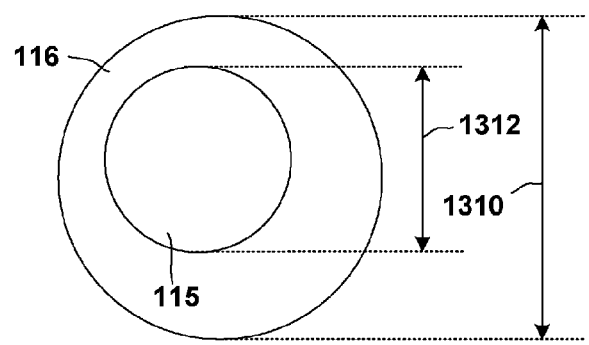

FIG. 13 is a top plan of the CWP 116 depicted in FIG. 1. The CWP 116 includes a first footprint that, because the footprint is circular, can be quantified by its diameter 1310. The CWP 116 is surmounted by a wire-bonding ball 115 that assists, for example, in the reverse wire-bonding process. The wire-bonding ball 115 has a top-view footprint that obscures at least some of the footprint of the CWP 116. Where the wire-bonding ball 115 is also substantially circular in profile, it can be quantified by its diameter 1312. In an embodiment the footprint of the wire-bonding ball 115 is about 100% the footprint of the CWP 116. In an embodiment the footprint of the wire-bonding ball 115 is about 90% the footprint of the CWP 116. In an embodiment the footprint of the wire-bonding ball 115 is about 80% the footprint of the CWP 116. In an embodiment the footprint of the wire-bonding ball 115 is about 70% the footprint of the CWP 116. In an embodiment the footprint of the wire-bonding ball 115 is about 67% the footprint of the CWP 116. In an embodiment the footprint of the wire-bonding ball 115 is less than about 67% the footprint of the CWP 116. In an embodiment the footprint of the wire-bonding ball 115 is about 50% the footprint of the CWP 116.

Figure 14:
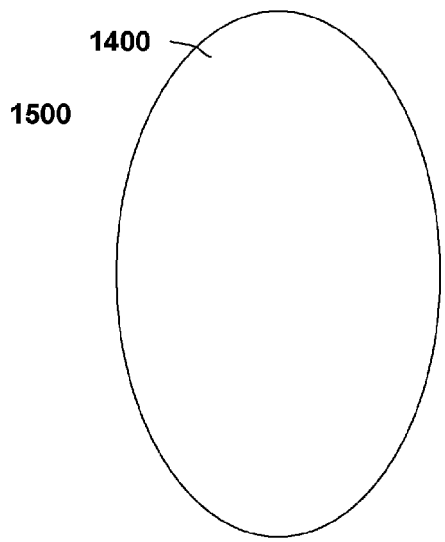

FIG. 14 is a top plan of a wire-bond pad 1400. The wire-bond pad 1400 exhibits an eccentric footprint as it appears upon a mounting substrate (not pictured). Consequently, the eccentric footprint is one embodiment of a curvilinear footprint as set forth in this disclosure. The eccentricity of the footprint can be quantified by ordinary mathematical descriptions. In an embodiment, the wire-bond pad 1400 includes a footprint eccentricity that is quantified by an aspect ratio of a largest characteristic length divided by a smallest characteristic length. In an embodiment, the aspect ratio is in a range from about 1 to about 2.

With respect to a wire-bonding ball and the area of the area of the wire-bond pad 1400 that it obscures, the wire-bonding ball can obscure any portion of the wire-bond pad 1400 as set forth in this disclosure. In an embodiment, placement of the wire-bonding ball (not pictured) on the eccentric footprint can be off-center as depicted in FIG. 13. In an embodiment, placement of the wire-bonding ball on the eccentric footprint can be centered with respect to bi-lateral symmetry, but closer to one focus of the eccentric footprint than to the other focus thereof. In an embodiment, placement can be both off-centered and closer to one focus than the other focus.

Figure 15:
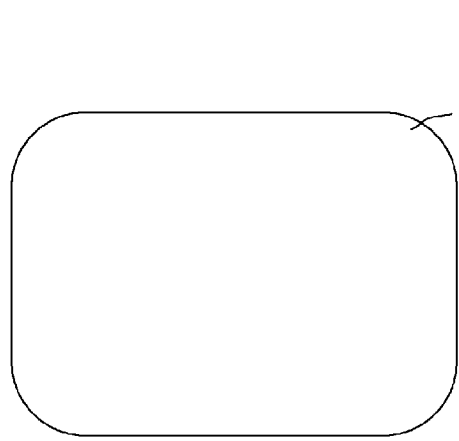

FIG. 15 is a top plan of a wire-bond pad 1500. The wire-bond pad 1500 exhibits a combination curvilinear/rectilinear footprint as it appears upon a mounting substrate (not pictured). Consequently, the curvilinear/rectilinear footprint is one embodiment of a "curvilinear footprint" as set forth in this disclosure. The curvilinear/rectilinear footprint can be quantified by ordinary mathematical descriptions. In an embodiment, the wire-bond pad 1500 is substantially symmetrical in quadrilateral symmetry. In an embodiment, the wire-bond pad 1500 is substantially symmetrical in only bilateral symmetry.

In an embodiment, the wire-bond pad 1500 includes a curvilinear/rectilinear footprint that is quantified by an aspect ratio of a largest characteristic length divided by a smallest characteristic length, and further quantified by the size of the rounded corners. In an embodiment, the aspect ratio is in a range from about 1 to about 2.

With respect to a wire-bonding ball and the area of the wire-bond pad 1500 that it obscures, the wire-bonding ball (not pictured) can obscure any portion of the wire-bond pad 1500 as set forth in this disclosure. In an embodiment, placement of the wire-bonding ball on the curvilinear/rectilinear footprint can be off-center as depicted in FIG. 13. In an embodiment, placement of the wire-bonding ball on the curvilinear/rectilinear footprint can be centered with respect to bi-lateral symmetry in one dimension, but closer to one end of the curvilinear/rectilinear footprint than the other end thereof. In an embodiment, placement can be both off-centered and closer to one focus than the other focus.

Figure 16:
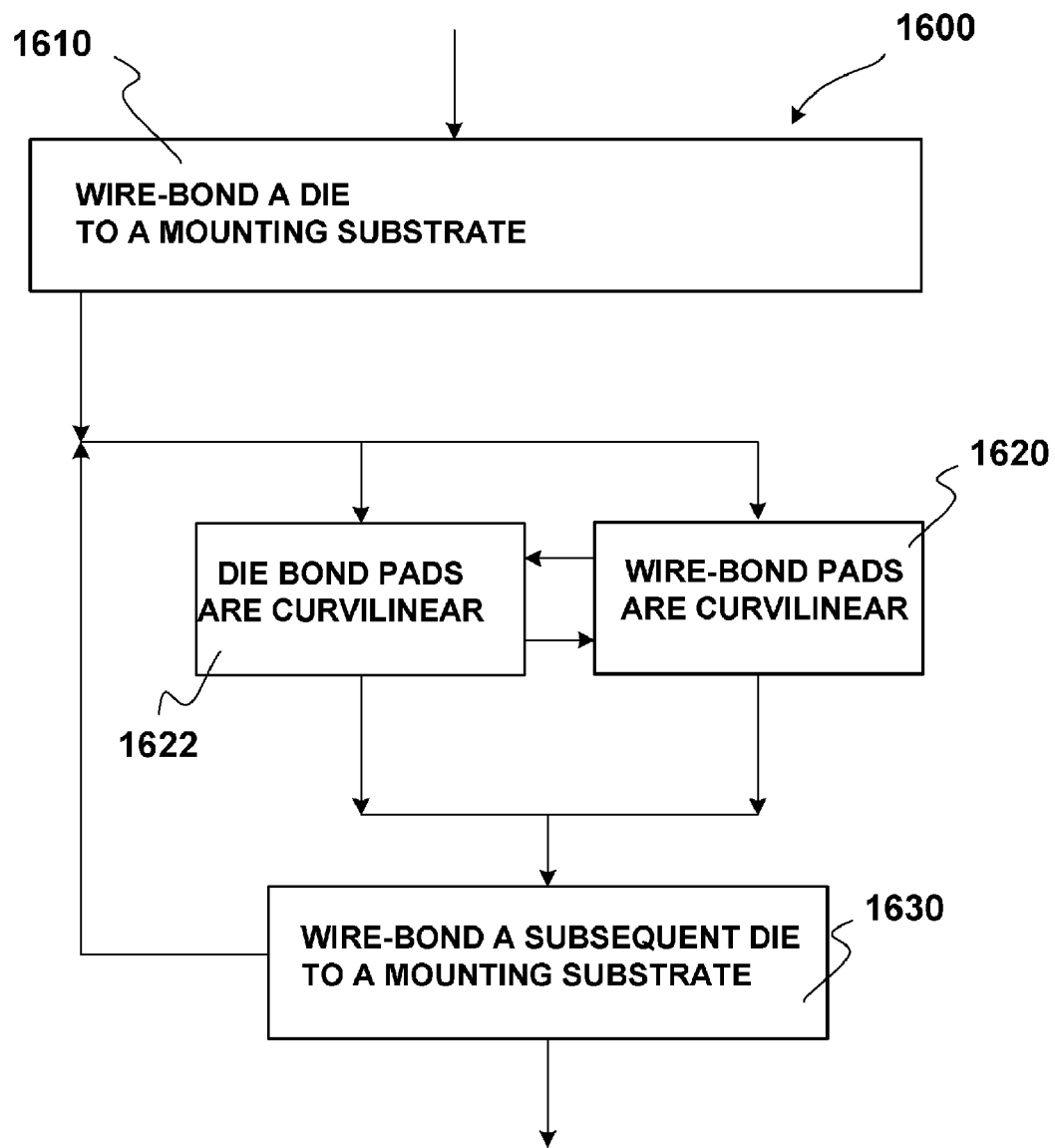
FIG. 16 is a process flow diagram according to various embodiments.

FIG. 16 is a process flow diagram according to various embodiments. The process 1600 includes reverse wire-bonding a wire-bond pad and a die bond pad.

At 1610, the process can commence by reverse wire-bonding a die to a mounting substrate. In an embodiment, the process flow terminates at 1610.

At 1620, the wire-bond pads are curvilinear. According to a process flow embodiment, the wire-bond pads are curvilinear and the die bond pads are substantially rectilinear as set forth herein. In an embodiment, the process flow terminates at 1620.

At 1622, the die bond pads are also curvilinear. According to a process flow embodiment, the die bond pads are curvilinear and the wire-bond pads are also curvilinear as set forth herein. In an embodiment, the process flow terminates at 1622.

At 1630, the process flow includes wirebonding a subsequent die to the mounting substrate. The subsequent die is stacked above the first die. This process flow includes an embodiment of reverse wire bonding as set forth herein. In an embodiment, the wire-bond pads are curvilinear. In an embodiment, the die bond pads are likewise curvilinear.

Figure 17:
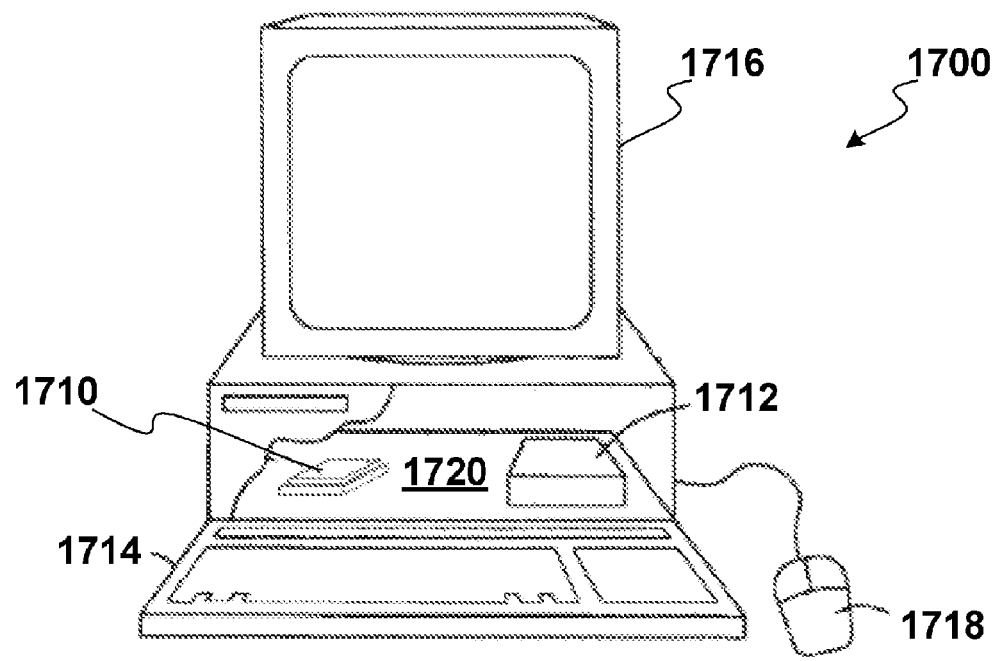
FIG. 17 is a depiction of a computing system according to an embodiment.

FIG. 17 is a depiction of a computing system according to an embodiment. One or more of the foregoing embodiments of a reverse-wire-bonding process or a CWP configuration may be utilized in a computing system, such as a computing system 1700 of FIG. 17. The computing system 1700 includes at least one processor (not pictured) which is enclosed in a microelectronic device package 1710, a data storage system 1712, at least one input device such as keyboard 1714, and at least one output device such as monitor 1716, for example. The computing system 1700 includes a processor that processes data signals, and may include, for example, a microprocessor, available from Intel Corporation. In addition to the keyboard 1714, the computing system 1700 can include another user input device such as a mouse 1718, for example. Similarly, depending upon the complexity and type of system, the computing system 1700 can include a board 1720 for mounting at least one of the microelectronic device package 1710, the data storage system 1712, or other components.

For purposes of this disclosure, a computing system 1700 embodying components in accordance with the claimed subject matter may include any system that utilizes a microelectronic device package, which may include, for example, a data storage device such as dynamic random access memory, polymer memory, flash memory, and phase-change memory. The microelectronic device package can also include a die that contains a digital signal processor (DSP), a micro controller, an application specific integrated circuit (ASIC), or a microprocessor.

Embodiments set forth in this disclosure can be applied to devices and apparatuses other than a traditional computer. For example, a die can be packaged with an embodiment of the reverse-wire-bonding process and/or a CWP configuration, and placed in a portable device such as a wireless communicator, or a hand-held device such as a personal data assistant and the like. Another example is a die that can be packaged with an embodiment of the reverse-wire-bonding process and/or a CWP configuration and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
   a mounting substrate;
   a first die disposed on the mounting substrate, wherein the first die includes a first plurality of die bond pads disposed along a first edge thereof, wherein the first wire-bond pad is part of a plurality of first wire-bond pads disposed on the mounting substrate and coupled to the first die at the first plurality of die bond pads;
   a second die disposed on the first die, wherein the second die includes a second plurality of die bond pads disposed along a first edge thereof;
   a plurality of second wire-bond pads disposed on the mounting substrate and coupled to the second die at the second plurality of die bond pads;
   a third die disposed on the second die, wherein the third die includes a third plurality of die bond pads disposed along a first edge thereof and wherein the respective first edges of the first die, the second die, and the third die are parallel;
   a plurality of third wire-bond pads disposed on the mounting substrate and coupled to the third die at the third plurality of die bond pads;
   wherein the plurality of first wire-bond pads, the plurality of second wire-bond pads, and the plurality of third wire-bond pads occupy a first characteristic dimension, wherein the first plurality of die bond pads, the second plurality of die bond pads, and the third plurality of die bond pads occupy a second characteristic dimension, and wherein the second characteristic dimension is greater than the first characteristic dimension.

2. The article of claim 1, further including a trace disposed between two adjacent wire-bond pads on the mounting substrate.

3. An article comprising:
   a mounting substrate;
   a first wire-bond pad disposed on the mounting substrate, wherein the first wire-bond pad includes a curvilinear footprint;
   a trace disposed between two adjacent wire-bond pads on the mounting substrate;
   a first die disposed on the mounting substrate, wherein the first die includes a first plurality of die bond pads disposed along a first edge thereof, wherein the first wire-bond pad is part of a plurality of first wire-bond pads disposed on the mounting substrate and coupled to the first die at the first plurality of wire-bond pads;
   a second die disposed on the first die, wherein the second die includes a second plurality of die bond pads disposed along a first edge thereof;
   a plurality of second wire-bond pads disposed on the mounting substrate and coupled to the second die at the second plurality of die bond pads;
   a third die disposed on the second die, wherein the third die includes a third plurality of die bond pads disposed along a first edge thereof;
   a plurality of third wire-bond pads disposed on the mounting substrate and coupled to the third die at the third plurality of die bond pads;
   wherein the plurality of first wire-bond pads, the plurality of second wire-bond pads, and the plurality of third wire-bond pads occupy a first characteristic dimension, wherein the first plurality of die bond pads, the second plurality of die bond pads, and the third plurality of die bond pads occupy a second characteristic dimension, and wherein the second characteristic dimension is greater than the first characteristic dimension.

4. The article of claim 3, further including a wire-bonding ball disposed on the curvilinear wire-bond pad, wherein the curvilinear wire-bond pad includes a first surface area, wherein the wire-bonding ball projects a second area onto the curvilinear wire-bond pad, and wherein the second area is about 67% of the first surface area.

* * * * *